United States Patent [19]

Eum

[11] Patent Number: 5,764,780

[45] Date of Patent: Jun. 9, 1998

[54] CIRCUIT FOR ELIMINATING NOISE OF AUDIO SIGNAL

[75] Inventor: Doo-Chan Eum, Suwon, Rep. of Korea

[73] Assignee: Samsung Electronics Co., Ltd., Kyungki-do, Rep. of Korea

[21] Appl. No.: 581,227

[22] Filed: Dec. 29, 1995

[30] Foreign Application Priority Data

Feb. 4, 1995 [KR] Rep. of Korea ............... 1995-2010

[51] Int. Cl.$^6$ .................................................. H04B 15/00
[52] U.S. Cl. ........................................ 381/94.5; 330/149
[58] Field of Search ............................ 381/94, 123, 13; 330/149; 375/249

[56] References Cited

U.S. PATENT DOCUMENTS

| | | | |
|---|---|---|---|
| 4,539,527 | 9/1985 | Ishigaki | 330/149 |
| 4,555,669 | 11/1985 | Namiki | 330/149 |
| 4,577,161 | 3/1986 | Hirohashi | 330/149 |
| 4,996,696 | 2/1991 | McCabe | 375/249 |

*Primary Examiner*—Curtis Kuntz
*Assistant Examiner*—Xu Mei
*Attorney, Agent, or Firm*—Sughrue, Mion, Zinn, Macpeak & Seas, PLLC

[57] ABSTRACT

A circuit for eliminating noise from a regenerated audio signal by detecting slope of the signal. A sensor senses an edge of a head switching pulse signal to thereby generate a predetermined control pulse. The circuit has a holder for holding a state of the regenerated audio signal in response to the control pulse and permitting charge or discharge of the held signal under a given control. A slope detector detects a slope from a fixed band of the audio signal and feeds back the detected slope to thereby control charge/discharge at the holder to alter the held signal level.

11 Claims, 2 Drawing Sheets

CIRCUIT FOR ELIMINATING NOISE OF AUDIO SIGNAL

BACKGROUND OF THE INVENTION

The present invention relates to a circuit for eliminating a noise in an audio signal processing apparatus, and more particularly to a circuit for eliminating noise by detecting slope of a signal.

In order to obtain sound of good quality in regenerating an audio signal from a video tape, it is important to eliminate the noise included in the signal.

FIG. 1 shows a conventional noise elimination circuit. There are provided in FIG. 1 the first and second amplifiers 10 and 30, a switch 20, and a first capacitor C1. Assuming that a noise is included in an audio signal A to be input to the first amplifier 10, as shown in FIG. 2, it is almost impossible to entirely eliminate the noise using the noise elimination circuit shown in FIG. 1 because the signal is just held constant in a part where the noise occurs and thereby distortion of the signal is caused. Such an operation will be explained in detail below with reference to FIG. 1.

The first amplifier 10 functions as a buffer. A pulse for control is input to the switch 20 of which one terminal is connected to an outputting terminal of the first amplifier 10. The control pulse is generated in an edge of a head switching pulse signal. If the control pulse is at a high state, the switch 20 is turned off, whereas if it is at a low state, the switch 20 is turned on. Under this assumption, when the control pulse is at the high state in a point of time the noise is generated, as shown in FIG. 2, and the switch 20 is thus turned off, the first capacitor C1 connected to the other terminal of the switch 20 holds node N at the voltage value obtained just before the switch 20 is turned off. As a result, the above value is maintained constant while the switch 20 is turned off. Therefore, there remains some noise in the portion of the signal indicated by the dotted line in FIG. 2.

SUMMARY OF THE INVENTION

It is an object of the invention to provide a noise elimination circuit capable of minimizing distortion of a reproduced (or regenerated) signal so that the signal can faithfully reproduce its original state.

In order to achieve the above object, the noise elimination circuit of an apparatus for regenerating an audio signal by means of a head having a head switching signal, said circuit comprising:

a) an inputting terminal for inputting a regenerated audio signal from the head;

b) an outputting terminal for outputting the audio signal from which a noise signal is eliminated;

c) means for sensing an edge of the head switching pulse signal and thereby generating a predetermined control pulse;

d) holding means for producing an intermediate signal which tracks a voltage level of the regenerated audio signal when said control pulse is not generated and holding a level of the regenerated audio signal when said control pulse is generated, said holding means being connected to said inputting terminal;

e) a band detector for detecting a fixed band of said intermediate signal to thereby transfer a band detected signal to said outputting terminal; and f) a slope detector for detecting a slope from said band detected signal and controlling said holding means, when said intermediate signal is holding a level, to discharge the level of said intermediate signal when the slope is detected to be falling and charging up the level of said intermediate signal when the slope is detected to be rising.

The slope detector may be embodied as a charging/discharging means for charging said band detected signal to said holding means and transferring electric current discharged from said holding means to said outputting terminal, said charging/discharging means being connected between said outputting terminal and said holding means.

BRIEF DESCRIPTION OF THE DRAWINGS

The above and other objects, advantages and features of the present invention will be more apparent from the following detailed description taken with the attached drawings in which.

DETAILED DESCRIPTION OF THE PREFERRED EMBODIMENT

Figure 1:
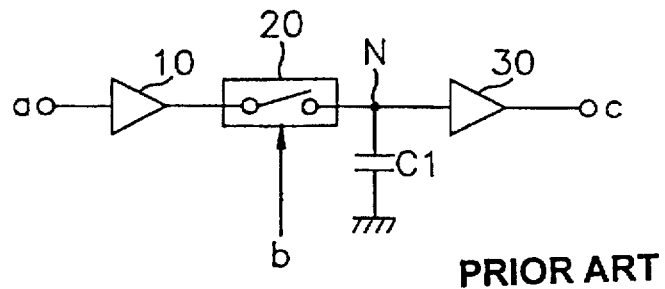
FIG. 1 shows a conventional noise elimination circuit.

In drawings, the same configuration components should be indicated by the same reference numerals in the various drawing figures. Further, in the following description, the specific details such as a detailed configuration element of circuit are set forth to provide a more thorough understanding of the present invention. It will be apparent, however, to one skilled in the art, that the present invention may be practiced without these specific details. In other instances, well known features have not been described in detail so as not to obscure the present invention.

Figure 3:
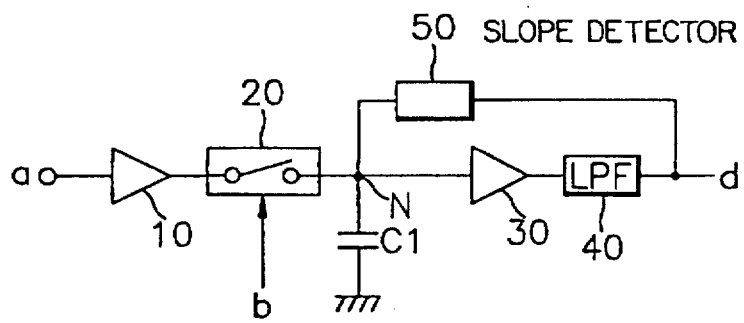
FIG. 3 shows a noise elimination circuit according to a general embodiment of the present invention.

FIG. 3 shows a noise elimination circuit according to a generalized embodiment of the present invention. In addition to the circuit shown in FIG. 1, the circuit of FIG. 3 further comprises a low pass filter 40 in between an outputting terminal of the second amplifier 30 and a final outputting terminal and a slope detector 50 in between a node N and an outputting terminal of the low pass filter 40. Advantageously, the output impedance of the first amplifier 10 is less than the input impedance of the second amplifier 30. Further, the switch 20 has excellent isolation in its switching feature so as to block the signal when the switch is off. An operation of the noise elimination circuit having such a configuration is discussed below.

Figure 2:
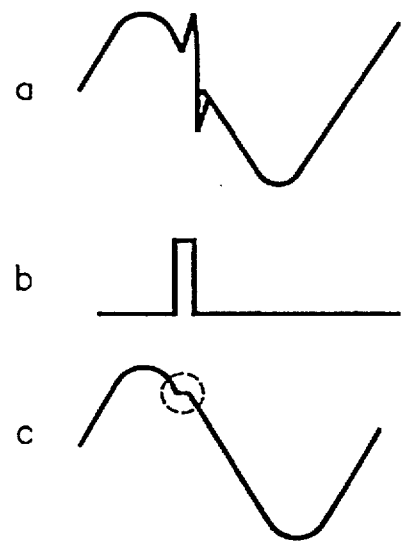
FIG. 2 shows operational wave forms of the circuit of FIG. 1.
Figure 4:
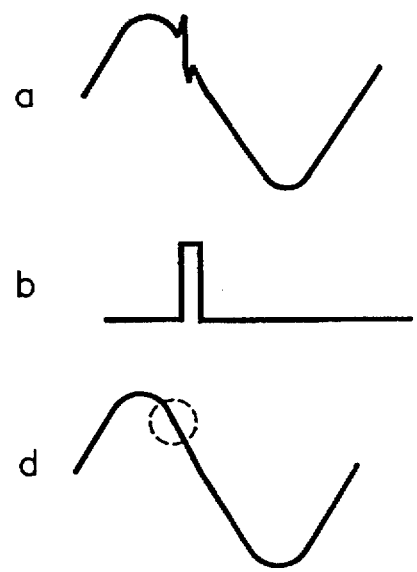
FIG. 4 shows operational wave forms of the circuit of FIG. 3.

During the time when there is no noise in the signal, the switch 20 is at an on state. At this time, as mentioned above, since the outputting impedance of the first amplifier 10 is less than the input impedance of the second amplifier 30, an input signal "a" is charged to the first capacitor C1 and it then continuously tracks the output of the amplifier 10. When noise is detected, the switch 20 is turned off by the control pulse "b". Thereby, the voltage value of node N obtained just before the switch is turned off, is stored in the first capacitor C1 and is then outputted through the second amplifier 30 and the low pass filter 40. Meantime, an outputting signal of the low pass filter 40 is fed-back and then input to the slope detector 50. The slope detector 50 senses the rising and falling (i.e., the slope) of the signals inputted to it. In response to the result of the slope sensing operation, the first capacitor C1 is caused to be charged or discharged as appropriate. That is to say, if the signal is on a rising trend, the first capacity C1 should be charged, whereas if it is on a falling trend, the first capacity C1 is discharged to recover the original signal. As a result, when the recovered signal "d" is finally outputted through the low pass filter 40, it is possible to entirely eliminate the remainder noise or the noise according to the on/off operation of the switch 20. FIG. 4 shows an output signal "d" in which no noise is included. A portion of wave form "c" taken at the dotted line in FIG. 4, corresponding to that of wave form "c" of FIG. 2, indicates a state that the noise has been eliminated.

Figure 5:
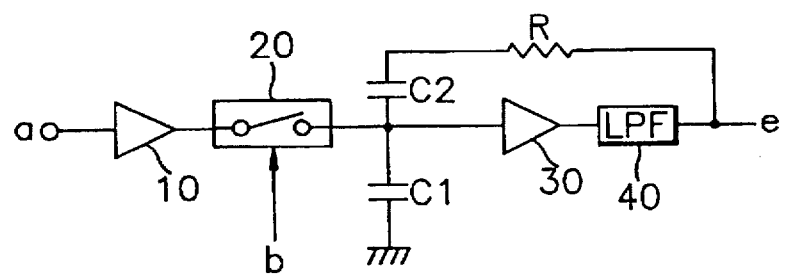
FIG. 5 shows a noise elimination circuit according to a specific embodiment of the present invention.

FIG. 5 shows a noise elimination circuit according to a specific embodiment of the present invention. In configuration of FIG. 5, resistance R and the second capacitor C2 are used as the slope detector 50 of the circuit configured according to FIG. 3. In the circuit of FIG. 5, if the original signal is on a rising trend, a voltage of the second capacitor C2 comes to be charged to the first capacity C1. On the other hand, if the original signal is on a falling trend, a voltage of the first capacity C1 is discharged through the second capacity C2 to thereby follow along the slope of the original signal.

As mentioned above, the present invention is to recover a signal faithfully reproducing the original one and to minimize the distortion of the signal by effectively eliminating the noise included therein.

In the meantime, although only the preferred embodiment of the present invention is described therein, various modifications can be implemented within the spirit and the scope of the present invention. Therefore, it is intended that the present invention not be limited to the particular embodiment disclosed as the best mode contemplated for carrying out the present invention, but that the present invention includes all embodiments falling within the scope of the appended claims.

What is claimed is:

1. A noise elimination circuit, for use in an apparatus for regenerating an audio signal by means of a plurality of heads which are switched according to a head switching signal, to remove noise due to switching of the heads, said circuit comprising:

an inputting terminal for inputting a regenerated audio signal from the head;

an outputting terminal for outputting the audio signal from which a noise signal is eliminated;

means for sensing an edge of the head switching signal and thereby generating a predetermined control pulse;

holding means for producing an intermediate signal which tracks a voltage level of the regenerated audio signal when said control pulse is not generated and holding a level of the regenerated audio signal when said control pulse is generated, said holding means being connected to said inputting terminal;

a band detector for detecting a fixed band of said intermediate signal to thereby transfer a band detected signal to said outputting terminal; and a slope detector for detecting a slope from said band detected signal and controlling said holding means, when said intermediate signal is holding a level, to discharge the level of said intermediate signal when the slope is detected to be falling and charging up the level of said intermediate signal when the slope is detected to be rising.

2. The noise elimination circuit as claimed in claim 1, wherein said band detector is a low pass filter.

3. The noise elimination circuit as claimed in claim 1, wherein said holding means comprises a switch and capacitor connected in series with one another, said switch being responsive to said control pulse so as to open when said control pulse is generated and to close when said control pulse is not generated.

4. The noise elimination circuit as claimed in claim 3, wherein said holding means further comprises:

a first buffer connected between said inputting terminal and said switch; and a second buffer having an input connected to said capacitor and said switch and an output connected to said band detector.

5. The noise elimination circuit as claimed in claim 4, wherein said first buffer has an output impedance which is less than an input impedance of said second buffer.

6. A noise elimination circuit, for use in an apparatus for regenerating an audio signal by means of a plurality of heads which are switched according to a head switching signal, to remove noise due to switching of the heads, said circuit comprising:

an inputting terminal for inputting a regenerated audio signal from the head;

an outputting terminal for outputting the audio signal from which a noise signal is eliminated;

means for sensing an edge of the head switching signal and thereby generating a predetermined control pulse;

holding means for producing an intermediate signal which tracks a voltage level of the regenerated audio signal when said control pulse is not generated and holding a level of the regenerated audio signal when said control pulse is generated, said holding means being connected to said inputting terminal;

a band detector for detecting a fixed band of said intermediate signal to thereby transfer a band detected signal to said outputting terminal; and charging/discharging means for charging said band detected signal to said holding means and transferring electric current discharged from said holding means to said outputting terminal, said charging/discharging means being connected between said outputting terminal and said holding means.

7. The noise elimination circuit as claimed in claim 6, wherein said band detector is a low pass filter.

8. The noise elimination circuit as claimed in claim 6, wherein said holding means comprises a switch and capacitor connected in series with one another, said switch being responsive to said control pulse so as to open when said control pulse is generated and to close when said control pulse is not generated.

9. The noise elimination circuit as claimed in claim 8, wherein said holding means further comprises:

a first buffer connected between said inputting terminal and said switch; and a second buffer having an input connected to said capacitor and said switch and an output connected to said band detector.

10. The noise elimination circuit as claimed in claim 9, wherein said first buffer has an output impedance which is less than an input impedance of said second buffer.

11. The noise elimination circuit as claimed in claim 6, wherein said charging/discharging means comprises a resistor and a capacitor connected in series with one another.

* * * * *